United States Patent
Akai et al.

(10) Patent No.: US 7,714,505 B2
(45) Date of Patent: May 11, 2010

(54) ELECTROLUMINESCENCE ELEMENT

(75) Inventors: Tomonori Akai, Tokyo-to (JP); Shigehiro Ueno, Tokyo-to (JP)

(73) Assignee: Dai Nippon Printing Co., Ltd., Tokyo-to (JP)

(*) Notice: Subject to any disclaimer, the term of this patent is extended or adjusted under 35 U.S.C. 154(b) by 163 days.

(21) Appl. No.: 11/772,954

(22) Filed: Jul. 3, 2007

(65) Prior Publication Data
US 2008/0122353 A1 May 29, 2008

(30) Foreign Application Priority Data
Jul. 10, 2006 (JP) .............................. 2006-189608

(51) Int. Cl.
*H01J 63/04* (2006.01)
(52) U.S. Cl. ...................................... 313/504
(58) Field of Classification Search ................ 313/504; 445/24–25
See application file for complete search history.

(56) References Cited

U.S. PATENT DOCUMENTS 5,620,557 A * 4/1997 Manabe et al. .............. 438/507

2005/0035710 A1 * 2/2005 Tanase et al. ............... 313/506

FOREIGN PATENT DOCUMENTS

| JP | 10-162959 | 6/1998 |
|---|---|---|
| JP | 10-223377 | 8/1998 |
| JP | 2002-075658 | 3/2002 |
| JP | 2003-077651 | 3/2003 |
| JP | 2003-338368 | 11/2003 |
| JP | 2004-127740 | 4/2004 |
| JP | 2004-227943 | 8/2004 |
| JP | 2004-296234 | 10/2004 |

OTHER PUBLICATIONS

Yong-Young Noh, et al; "Highly sensitive thin-film organic phototransistors: Effect of wavelength of light source on device performance", Journal of Applied Physics 98, 074505 (2005).

* cited by examiner

*Primary Examiner*—Joseph L Williams
*Assistant Examiner*—Hana A Sanei
(74) *Attorney, Agent, or Firm*—Ladas & Parry LLP

(57) ABSTRACT

An object of the present invention is to provide an EL element, which is with a problem of the EL layer deterioration caused at the time of forming a cathode layer on an EL layer resolved, and without the decline of the original functions; and a production method suitable for producing such an EL element. The object has been achieved by providing an EL element having a lamination structure with an anode layer, an EL layer, a charge transporting protection layer and a cathode layer formed in this order on a substrate, and by using a hole transporting material such as TPD for the charge transporting protection layer.

6 Claims, 1 Drawing Sheet

ELECTROLUMINESCENCE ELEMENT

BACKGROUND OF THE INVENTION

1. Field of the Invention

The present invention relates to an electroluminescence element.

2. Description of the Related Art

Since an electroluminescence (hereafter, it may be abbreviated as "EL") element having a light emitting layer interposed between a pair of electrodes for emitting a light beam by applying a voltage between the electrodes has a high brilliance among various display elements and a high response speed, it attracts the attention so as to promote its use in practice.

For the production of the EL element, a method of successively laminating an anode layer, an EL layer and a cathode layer onto a substrate is adopted. In actually forming the EL layer, various layers comprising the EL layer are successively laminated.

Among the above-mentioned layers, it is efficient to laminate by sputtering the electroconductive layers such as the anode layer and the cathode layer in terms of production. However, at the time of laminating the cathode layer, since the base is the EL layer, the EL layer performance may easily be deteriorated because the EL layer is exposed to sputtering particles having high energy or to the plasma atmosphere in the case plasma is used.

The material comprising the EL layer of the EL element is vulnerable to the physical or chemical environmental change and often generates the dark spots. To prevent permeation of the moisture content in the air, one of the cause to generate dark spots, the entire EL element may be covered with a protection film for shielding the moisture content (Japanese Patent Application Laid-Open (JP-A) No. 2003-338368).

A method of avoiding introduction of the moisture content or the oxygen in the air to the cathode comprising an ITO, or the like by providing the cathode of the organic EL element comprising an electron injecting electrode layer (made of such as Mg, Ca, or Ba) and an amorphous transparent electroconductive layer (made of a In—Zn—O based oxide film) from the organic light emitting layer side has been proposed (JP-A No. 10-162959).

A method of successively laminating a first electrode, a sputtering protection layer and a second electrode on a substrate, in which the sputtering protection layer is made of gold, nickel or aluminum has also been proposed (JP-A No. 2003-77651).

A method of providing a cathode layer of the organic EL element in a two layer structure, in which an electron transporting protection layer is provided between the two layers as a layer of a mixture of an electron transporting organic material such as a BCP (bathocuproin) and Li, Cs, Ba, Sr, Ca, or the like as an alkaline metal or an alkaline earth metal has also been proposed (JP-A No. 2004-127740).

A cathode structure of an organic EL element containing a thin metal layer covered with a wide band gap semiconductor (such as ZnSe) to be directly contacted with an organic EL region has also been proposed (JP-A No. 10-223377).

Alternatively, the organic EL layer of an organic EL light emitting element that comprises a substrate, a cathode, an organic EL layer, and an upper transparent anode has been proposed. Here, the organic EL layer comprises an organic light emitting layer and a hole injecting layer, in which the hole injecting layer contacts with the upper transparent anode and has a 30 to 1,000 nm thickness (JP-A No. 2004-227943).

Furthermore, a buffer structure comprising a first buffer layer containing an alkaline halide and a second buffer layer containing a phthalocyanine formed between a light emitting layer and a sputtering cathode layer has been proposed (JP-A No. 2002-75658).

A buffer layer containing a phthalocyanine compound with at least one metal selected from the group consisting of Au, Pt, Pd and Ag, and formed between an organic El layer and an upper electrode has also been proposed (JP-A No. 2004-296234).

Although JP-A No. 2003-338368 discloses that the cathode already laminated at the time of forming the protection film of a high melting point metal on the cathode (second electrode) provides a buffer so that the protection film can be formed by sputtering, any measure for solving the deterioration of the EL layer at the time of laminating the cathode is not shown.

In JP-A No. 10-162959, although the electron injecting electrode layer as the lower layer may produce the protection effect at the time of forming an amorphous transparent electroconductive film on the electron injecting electrode layer by sputtering, a problem of transmittance decline caused when a sufficient thickness to perform the protection effect is provided to the layer cannot be avoided.

JP-A No. 2003-77651 discloses an issue of solving the deterioration of the EL layer at the time of laminating the second electrode. However, it has been difficult to achieve both the necessary protection function and transparency because, in the case of using a metal, a thicker layer which is preferable in terms of the protection function adversely deteriorates the transparency.

In JP-A No. 2004-127740, the cathode layer has a three layer structure including the electron transporting protection layer, and a metal is mixed. Accordingly, a problem is involved in that the protection effect and the transmittance can hardly be achieved at the same time. Moreover, due to the introduction of the alkaline metal or the alkaline earth metal, stability of the electron transporting protection layer may be deteriorated.

As to JP-A No. 10-223377, transparency cannot be obtained sufficiently with a cathode structure comprising a wide band gap semiconductor such as ZnSe and a thin metal layer.

As to JP-A No. 2004-227943, although the hole injecting layer may perform the protection function at the time of forming the upper transparent electrode, the problem at the time of forming the cathode after the organic light emitting layer is not touched upon.

Furthermore, JP-A No. 2002-75658 discloses that the damage applied to the organic layer such as the light emitting layer at the time of sputtering the cathode can be reduced. However, a problem is involved in that the driving voltage is made higher if the film thickness of the second buffer layer containing a phthalocyanine is made thicker for improving the protection effect. Moreover, since the phthalocyanine absorbs a visible light beam (blue to green), a problem of the transmittance decline is also involved.

JP-A No. 2004-296234 discloses that the damage to the organic EL layer at the time of forming the upper electrode can be alleviated. Nonetheless, since the buffer layer contains a phthalocyanine compound and a metal is doped to the phthalocyanine compound, as in the above-mentioned case, a problem of the transmittance decline is also involved.

SUMMARY OF THE INVENTION

An object of the present invention is to provide, without decline of the original function, an EL element capable of solving the above-mentioned problems caused at the time of forming a second electrode layer on an EL layer and a production method suitable for producing such an EL element.

According to the discussion of the present inventors, it is found out that deterioration of the EL layer, which has easily be caused conventionally at the time of forming the cathode layer, can be restrained by laminating a charge transporting material by the chemical vapor deposition method or by the vacuum deposition method prior to the formation of the cathode layer of the EL element, and that a problem is not generated in terms of the performance of the EL element to be obtained even in the case of laminating such a layer in advance. The present invention is thus achieved.

To achieve the object, the present invention provides an EL element comprising: an anode layer, an EL layer including at least a light emitting layer, a charge transporting protection layer and a cathode layer provided in this order on a substrate, wherein the charge transporting protection layer is made of an organic material alone, the charge transporting protection layer and the cathode layer have light transmitting properties, and a transmittance of the charge transporting protection layer at a 450 to 600 nm wavelength based on 100 nm film thickness is 25% or more.

According to the present invention, providing of the charge transporting protection layer between the EL layer and the cathode layer enables to provide an EL element capable of restraining deterioration of the EL layer at the time of forming the cathode layer, and to further provide the EL element without decline of the original function such as the excessive resistance. Moreover, since the charge transporting protection layer and the cathode layer has the light transmitting properties, an EL element suitable for the use as the top emission type can be provided. Furthermore, since the charge transporting protection layer is made of an organic material alone and has a predetermined transmittance, even in the case the thickness of the charge transporting protection layer is made relatively thick, a desired transmittance can be obtained. Accordingly, the protection effect and the transmittance can be achieved at the same time.

Moreover, according to the present invention, it is preferable that the EL layer contains an electron injecting layer, and the electron injecting layer is formed between the light emitting layer and the charge transporting protection layer. This is because the formation of the charge transporting protection layer can restrain deterioration of the light emitting layer and the electron injecting layer at the time of forming the cathode layer.

Furthermore, according to the present invention, it is preferable that the thickness of the charge transporting protection layer is 10 nm to 1,000 nm. Since the thickness of the charge transporting protection layer is determined, an EL element capable of certainly avoiding insufficiency in the protection effect caused when the thickness is too small and increase in the resistance caused when the thickness is excessive can be provided.

The present invention further provides a production method for an EL element, comprising steps of successively laminating on a substrate: an anode layer, an EL layer including at least a light emitting layer, a charge transporting protection layer made of an organic material alone, which has light transmitting properties and a transmittance of 25% or more at a 450 nm to 600 nm wavelength based on 100 nm film thickness, and a cathode layer having light transmitting properties, wherein the step of laminating the charge transporting protection layer is carried out by a chemical vapor deposition method, a vacuum deposition method, or a coating method, and the step of laminating the cathode layer is carried out by a sputtering method or an ion plating method.

According to the present invention, since the charge transporting protection layer is laminated by the chemical vapor deposition method, the vacuum deposition method or the coating method, and since the cathode layer is laminated by the sputtering method or the ion plating method, an EL element capable of restraining deterioration of the EL layer at the time of forming the layers and also capable of efficiently laminating the cathode layer can be provided. Moreover, since the charge transporting protection layer and the cathode layer have the light transmitting properties, and since the charge transporting protection layer made of an organic material alone has a predetermined transmittance, an EL element suitable for the use as the top emission type as mentioned above, which is also capable of achieving both the protection effect and the transmittance can be obtained.

Furthermore, the present invention provides a functional device comprising: an anode layer, a functional layer for performing its function by the electric field or the current, a charge transporting protection layer and a cathode layer provided on a substrate in this order, wherein the charge transporting protection layer is made of an organic material alone, the charge transporting protection layer and the cathode layer have light transmitting properties, and a transmittance of the charge transporting protection layer based on 100 nm film thickness with respect to a 450 nm to 600 nm wavelength is 25% or more.

According to the present invention, since the charge transporting protection layer is provided between the functional layer for performing its function by the electric field or the current and the cathode layer, a functional device capable of restraining deterioration of the functional layer at the time of forming the cathode layer can be provided. Moreover, since the charge transporting protection layer and the cathode layer have the light transmitting properties, and also the charge transporting protection layer made of an organic material alone has a predetermined transmittance, it is suitable for a functional device for taking out a light beam from the cathode layer side or receiving a light beam so that the protection effect and the transmittance can be achieved at the same time.

According to the present invention, since the charge transporting protection layer is provided between the EL layer and the cathode layer, an EL element capable of restraining deterioration of the EL layer at the time of forming the cathode layer without decline of the original function such as the excessive resistance can be provided. Moreover, since the charge transporting protection layer and the cathode layer has the light transmitting properties, an EL element suitable for the use as the top emission type can be provided. Furthermore, since the charge transporting protection layer is made of an organic material alone with a predetermined transmittance, the protection effect and the transmittance can be achieved at the same time.

DESCRIPTION OF THE PREFERRED EMBODIMENT

Figure 1:
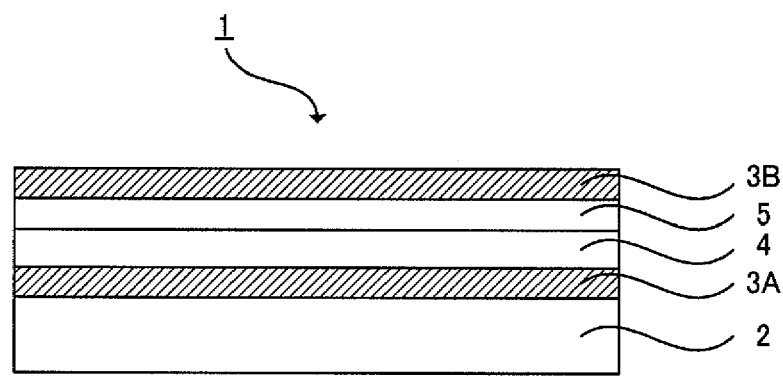
FIG. 1 is a diagram showing a lamination structure of an EL element of the present invention.

FIG. 1 is a diagram showing a lamination structure of an EL element of the present invention.

Figure 2:
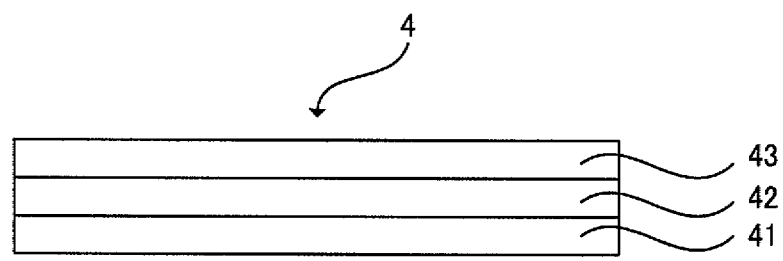
FIG. 2 is a diagram showing a lamination structure of an EL layer in the present invention.

FIG. 2 is a diagram showing an example of a lamination structure of an EL layer in the present invention.

Hereafter, an EL element of the present invention and a production method therefor, and a functional device will be explained in detail.

A. EL Element

The electroluminescence element of the present invention comprises: an anode layer, an EL layer including at least a light emitting layer, a charge transporting protection layer and a cathode layer provided in this order on a substrate, wherein the charge transporting protection layer is made of an organic material alone, the charge transporting protection layer and the cathode layer have the light transmitting properties, and the transmittance of the charge transporting protection layer at the 450 to 600 nm wavelength based on the 100 nm film thickness is 25% or more.

As shown in FIG. 1, a basic EL element 1 in the present invention has a lamination structure with an anode layer 3A, an EL layer 4, a charge transporting protection layer 5 and a cathode layer 3B laminated in this order on a substrate 2. Here, as it will be described later, the EL layer 4 itself may have a lamination structure comprising various layers. Moreover, the EL element 1 may have a multi-photon structure with two or more layers laminated.

As mentioned in the description of the prior art, the cathode layer 3B, or the entirety of the EL element 1 may be covered with a moisture preventive covering layer, or the like.

Hereafter, each configuration of the EL element of the present invention will be explained.

1. Charge Transporting Protection Layer

The charge transporting protection layer of the present invention is formed between the EL layer and the cathode layer, comprises an organic material alone, and has the light transmitting properties and the transmittance at a 450 nm to 600 nm wavelength based on the 100 nm film thickness of 25% or more.

The charge transporting protection layer 5, characteristics of the present invention, comprises a charge transporting material having a high electron mobility. Moreover, the charge transporting protection layer is made of an organic material alone. That is, the charge transporting material is an organic material alone having a high electron mobility.

In the present invention, the "organic material alone" refers to an organic material without a metal, an acid, or the like being introduced. For example, a BCP with an alkaline metal or an alkaline earth metal introduced is not an organic material alone, whereas a BCP itself is an organic material alone. Moreover, for example, an organic material, such as $Alq_3$, including a metal as a constituent element for a material is regarded an organic material alone in the present invention.

In the present invention, the "organic material alone" refers to an organic material without a metal, an acid, or the like being introduced. For example, a BCP with an alkaline metal or an alkaline earth metal introduced is not an organic material alone, whereas a BCP itself is an organic material alone.

Moreover, the charge transporting protection layer has light transmitting properties, that is, it is transparent so that the transmittance in the all wavelength range of 450 nm to 650 nm based on the 100 nm film thickness is 25% or more, it is more preferably 50% or more, and it is further preferably 80% or more. If the above-mentioned transmittance is in the above-mentioned range, an EL element preferable for the top emission type can be provided.

The above-mentioned transmittance is a value measured with a spectrophotometer for a film obtained by the vacuum deposition of each charge transporting material on a washed glass substrate so as to have a 100 nm film thickness. As the spectrophotometer, for example, UV-3100PC produced by Shimadzu Corporation can be used. Moreover, the film thickness is estimated from the film formation rate based on the film thickness in the case of forming a single film on a washed glass substrate. For the film thickness measurement, for example, a probe microscope (Nanopics 1000 produced by SII NanoTechnology Inc.) can be used.

Here, it is presumed that the conventional protection film using phthalocyanine has a relatively low transmittance in the all wavelength range of 450 nm to 650 nm.

For example, J. Appl. Phys. 98, 074505 (2005) discloses the light absorption degree of copper phthalocyanine (CuPc) at a 150 nm film thickness. More specifically, it mentions that the maximum value of the light absorption degree in the visible range (450 nm to 650 mn) of CuPc at a 150 nm film thickness is abs=1.17 at the 617 nm wavelength, that is, it is 6.8% based on the transmittance. According to J. Appl. Phys. 98, 074505 (2005), the minimum value of the transmittance in the visible range (450 nm to 650 nm) is 6.8% (617 nm wavelength) at the 150 nm film thickness, 17% (617 nm wavelength) at the 100 nm film thickness, and it is 34% (617 nm wavelength) at the 60 nm film thickness.

Moreover, the present inventors have measured the transmittance with a spectrophotometer for a CuPc film formed by the vacuum deposition method on a washed glass substrate so as to have a 10 nm film thickness. As a result, the minimum value of the transmittance in the visible range (450 nm to 650 nm) with a 10 nm film thickness of CuPc was 81% (626 nm wavelength). According to the calculation of the transmittance at the 100 nm film thickness based on the value, the minimum value is 12.5% (626 nm wavelength).

Furthermore, the present inventors have measured the transmittance with a spectrophotometer for a TPD film formed by the vacuum deposition method on a washed glass substrate so as to have a 100 nm film thickness. As a result, the minimum value of the transmittance in the visible range (450 nm to 650 nm) with a 100 nm film thickness of TPD was 95% (650 nm wavelength).

The charge transporting material is not particularly limited as long as it is an organic material alone having a high electron mobility and capable of satisfying the above-mentioned transmittance. For example, oxadiazol derivatives such as BND, PBD; triazol derivatives such as TAZ; triadine derivatives; phenanthroline derivatives such as BCP; carbazol biphenyl derivatives such as CBP; silol derivatives; perylene derivatives; pyridine derivatives; pyrimidine derivatives; quinoquisaline derivatives; cyclopentadiene derivatives; bis-styryl benzene derivatives; distyryl pyradine derivatives; diphenyl quinine derivatives; or nitro substituted fluorene derivatives can be used, but it is not limited thereto. Furthermore, among the materials known as the hole transporting material, a material having a high mobility of not only the hole but also the electron, such as TPD can be used.

The thickness of the charge transporting protection layer may be a thickness capable of obtaining the protection effect and satisfying the above-mentioned transmittance, and thus it can be set optionally according to the kind of the charge transporting material and the method for forming the cathode layer. Specifically, the thickness of the charge transporting protection layer is preferably 10 nm to 1,000 nm, it is more preferably 50 nm to 500 nm, and it is further preferably 70 nm to 150 nm. In the case the thickness of the charge transporting protection layer is thinner than the above-mentioned range, the protection effect may not be obtained sufficiently. Moreover, in the case the thickness of the charge transporting protection layer is thicker than the above-mentioned range, the resistance may be large or the film formation time may be prolonged.

As to the method for forming the charge transporting protection layer 5, it is more preferable to use a method for adhering a lower energy material by a chemical vapor deposition method, by a vacuum deposition method that is in a range of a physical vapor deposition method, or by a coating method than to use a method for adhering a higher energy material by a physical vapor deposition method such as a sputtering method or an ion plating method so as not to cause deterioration of the EL layer 4 as the lower layer. This is because, in the chemical vapor deposition method or the vacuum deposition method, the energy applied to the EL layer 4, which is the subject for forming the charge transporting protection layer 5, is low due to a low kinetic energy of the material as gas. Specifically in the case of the vacuum deposition method, it is also advantageous that a gas, which may be reactive, such as oxygen cannot be introduced. Therefore, in the case of adopting the sputtering method, the ion plating method, or the chemical vapor deposition method, it is preferable to introduce a gas which has no reactivity such as rare gas rather than introducing a gas such as oxygen, which may be reactive.

As the vacuum deposition method, a resistance heating deposition method, a flash deposition method, an arc deposition method, a laser deposition method, a high frequency heating deposition method, or an electron beam heating deposition method can be presented.

Moreover, as the sputtering method, a DC two pole sputtering method, an RF two pole sputtering method, a three pole sputtering method, a four pole sputtering method, a ECR sputtering method, an ion beam sputtering method, a magnetron sputtering method, or the like can be presented. In addition to them, as a sputtering method capable of restraining the damage to the lower layer, a grade sputtering method, a facing target sputtering method, a 2 V-shaped cathode facing target sputtering method, a plasma bound facing target sputtering method, a mirrortron sputtering method, a facing & conical shape target sputtering method, or the like can be presented.

Furthermore, in the case of the coating method, a coating solution prepared by dissolving or dispersing the charge transporting material in a solvent is used. As the coating method, an ink jet method, a spin coating method, a casting method, a dipping method, a bar coating method, a blade coating method, a roll coating method, a gravure coating method, a spray coating method, or the like can be presented.

2. Substrate

The substrate 2 is for supporting the layers such as the anode layer 3A and thereafter. In the case of taking out the light beam generated by the light emission from both the substrate 2 side and the cathode layer 3B side, it is preferable that the substrate has transparency, however, in the case of taking out the light beam from the cathode layer 3B side, it is not always necessary to have the transparency.

As specific examples of the material for forming the substrate 2, inorganic materials such as quartz, glass, silicon wafer, and glass formed with TFTs (thin film transistors) can be recited.

Alternatively, polymeric materials such as polycarbonate (PC), polyethylene terephthalate (PET), polybutylene terephthalate (PBT), polyphenylene sulfide (PPS), polyimide (PI), polyamide-imide (PAI), polyether sulfone (PES), polyetherimide (PEI), and polyether ether ketone (PEEK) can be recited, for example.

Among them, quartz, glass, and silicon wafer, or polyimide (PI), polyamide-imide (PAI), polyether sulfone (PES), polyetherimide (PEI), and polyether ether ketone (PEEK) that are super-engineering plastics are preferred as a substrate. This is because that these materials have heat resistance against 200° C. or more, so that the temperature of the substrate can be elevated in the production step. Especially, when an active drive display device using TFT is manufactured, the above-mentioned materials can be suitably used, since the temperature becomes high in the production step.

It is preferable that the thickness of the substrate 2 is properly selected, depending upon the material used for the substrate 2 and usage of the organic EL element. Specifically, the thickness of the substrate 2 is around 0.005 mm to around 5 mm.

When the polymeric material is used for the substrate 2, the EL layer may be deteriorated with gas generated from this polymeric material. Thus, a gas barrier layer comprises such as silicon oxide or silicon nitride may be formed between the substrate 2 and the anode layer 3A.

3. Anode Layer

The anode layer 3A may be or may not be transparent or translucent depending on the usage of the EL element 1. For example, in the case of taking out the light beam from both the substrate 2 side and the cathode layer 3B side, it is preferable that the anode layer 3A is transparent or translucent, and in the case of taking out the light beam from the cathode layer 3B side, the anode layer 3A may not always be transparent or translucent.

The material for providing the anode layer 3A is not particularly limited as long as it is an electroconductive material. For example, metals such as Au, Ta, W, Pt, Ni, Pd, Cr, Cu, Mo, an alkaline metal and an alkaline earth metal, oxides of these metals, alloys such as an Al alloy including AlLi, AlCa and AlMg, a Mg alloy including MgAg, a Ni alloy, a Cr alloy, an alloy of an alkaline metal, and an alloy of an alkaline earth metal can be presented.

The above-mentioned electroconductive material may be used either alone or as a combination of at least two kinds. In the case of using two or more kinds, layers of each material may be laminated.

Furthermore, as the electroconductive material, electroconductive inorganic oxides such as In—Sn—O, In—Zn—O, In—O, Zn—O, Zn—O—Al, and Zn—Sn—O, polythiophene with metal doped, polyaniline, polyacetylene, polyalkyl thiophene derivatives, electroconductive polymers such as polysilane derivatives, α-Si, α-SiC, or the like can also be used.

As the method for forming the anode layer 3A, the sputtering method, the vacuum heating deposition method, the EB deposition method, the ion plating method, or the like can be presented.

4. EL Layer

The EL layer in the present invention includes at least a light emitting layer. The EL layer 4 can consist of a light emitting layer (fluorescent layer), however, for the purpose of improving the injection properties and the transporting properties of the electron and the hole, it often has a lamination structure with various layers such as a hole injecting and transporting layer and an electron injecting layer laminated in addition to the light emitting layer. As to the lamination structure, there are various kinds thereof. For example, the following (1) to (3) lamination structures are recommended, but it is not limited thereto.

(1) Hole injecting and transporting layer/light emitting layer (2) Light emitting layer/electron injecting layer (3) Hole injecting and transporting layer/light emitting layer/electron injecting layer FIG. 2 shows an example of the EL layer 4 having the lamination structure with the hole injecting and transporting layer 41, the light emitting layer 42 and the electron injecting layer 43 successively laminated as mentioned above.

Moreover, it is also possible to provide a layer having a plurality of functions by mixing materials of different functions instead of separating the functions of layers as mentioned above.

In particular, it is preferable that the EL layer has at least the light emitting layer and the electron injecting layer laminated. At the time, it is preferable that the light emitting layer, the electron injecting layer and the charge transporting protection layer are laminated in this order. Since the charge transporting protection layer is formed, deterioration of the light emitting layer and the electron injecting layer can be restrained at the time of forming the cathode layer.

Hereafter, the hole injecting and transporting layer, the light emitting layer and the electron injecting layer will be explained.

(1) Hole Injecting and Transporting Layer

The material used for the hole injecting and transporting layer is not particularly limited as long as it is a material capable of stably transporting holes injected from the anode layer into the light emitting layer. As examples of the material used for the hole injecting and transporting layer, a phenyl amine based one, a star burst type amine based one, a phthalocyanine based one; oxides such as vanadium oxide, molybdenum oxide, ruthenium oxide, and aluminum oxide; amorphous carbon; or polyaniline, polythiophene, polyphenylene vinylene and derivatives thereof can be used. More specifically, bis(N-(1-naphthyl-N-phenyl) benzidine ($\alpha$-NPD), 4,4,4-tris(3-methyl phenyl phenyl amino) triphenyl amine (MT-DATA), poly (3,4-ethylene dioxythiophene)-polystyrene sulfonic acid (PEDOT-PSS), and polyvinyl carbazole (PVCz) can be presented as examples.

Moreover, the thickness of the hole injecting and transporting layer is not particularly limited as long as it is a thickness capable of sufficiently performing the function of injecting holes from the anode layer or the cathode layer and transporting the holes to the light emitting layer. Specifically, it is in a range of 0.5 nm to 300 nm, in particular it is preferably in a range of 10 nm to 100 nm.

As examples for a method for forming the hole injecting and transporting layer, the vapor deposition method, a printing method, an ink jet method, a spin coating method, a casting method, a dipping method, a bar coating method, a blade coating method, a roll coating method, a gravure coating method, a flexographic printing method, a spray coating method, and a self-assembly method (an alternate adsorption method and a self-assembled monomolecular filming method) can be cited, but the method is not restricted thereto. Among them, the vapor deposition method, the spin coating method, and the inkjet method are preferred.

(2) Light Emitting Layer

The light emitting layer of the present invention has the function that provides a field where electrons and holes are recombined to emit light, and a pigment based light emitting material, a metal complex based light emitting material or a polymer based light emitting material is usually used.

As the pigment based light emitting material that can form the light emitting layer, for example, cyclopentadiene derivatives, tetraphenyl butadiene derivatives, triphenyl amine derivatives, oxadiazol derivatives, pyrazoloquinoline derivatives, distylyl benzene derivatives, distylyl arylene derivatives, silol derivatives, a thiophene ring compound, a pyridine ring compound, perynon derivatives, perylene derivatives, oligothiophene derivatives, triphmanyl amine derivatives, coumalin derivatives, oxadiazol dimer, or pyrazoline dimer can be presented.

Moreover, as the metal complex based light emitting material that can form the light emitting layer, for example, metal complexes having Al, Zn, Be, Ir or Pt, or a rare earth metal such as Tb, Eu, Dy as the central metal, and having oxadiazol, thiadiazol, phenyl pyridine, phenyl benzoimidazol, a quinoline structure, or the like as the ligand can be cited. As examples of the metal complex, aluminum quinolinol complex, benzoquinolinol beryllium complex, benzoxazol zinc complex, benzothiazol zinc complex, azomethyl zinc complex, porphiline zinc complex, europium complex, iridium metal complex, or platinum metal complex can be cited. Specifically, tris(8-quinolinolato)aluminum complex (Alq3) can be presented.

As the polymer based light emitting material that can form the light emitting layer, recitation can be made of, for example, polyparaphenylene vinylene derivatives, polythiophene derivatives, polyparaphenylene derivatives, polysilane derivatives, polyacetylene derivatives, polyvinylcarbazole, polyfluorenone derivatives, polyfluorene derivatives, polyquinoxaline derivatives, polydialkylfluorene derivatives, and copolymers of any of them. Further, polymers of the above-mentioned pigment based light emitting materials and the above-mentioned metal complex based light emitting materials are also recited.

The thickness of the light emitting layer is not particularly limited as long as it is a thickness capable of providing the field for recombination of electrons and holes so as to provide the light emitting function. For example, it can be about 1 nm to 200 nm.

Moreover, a dopant that performs fluorescent emission or phosphorescent emission may be incorporated into the light emitting layer so as to improve the light emitting efficiency and change the light emission wavelength, for example. As such a dopant, for example, perylene derivatives, coumarin derivatives, rubrene derivatives, quinacridone derivatives, squalium derivatives, porphiline derivatives, styryl pigments, tetracene derivatives, pyrazoline derivatives, decacyclene, phenoxazone, quinoxaline derivatives, carbazol derivatives, and fluolene derivatives can be presented.

The method for forming the light emitting layer is not particularly limited, so long as it enables the formation of a micropattern required by the EL element. As the formation method for the light emitting layer, recitation can be made, for example, of the vapor deposition method, a printing method, an ink jet method, a spin coating method, a casting method, a dipping method, a bar coating method, a blade coating method, a roll coating method, a gravure coating method, a flexographic printing method, a spray coating method, and a self-assembly method (an alternate adsorption method and a self-assembled monomolecular filming method). Among them, the vapor deposition method, the spin coating method, and the inkjet method are preferred.

When a display device of a full color display type or a multicolor display type is produced by using the EL element 1, it is necessary to form respectively a minute shape of each of the light emitting layers emitting different colors and arrange them in a given arrangement. Thus, the light emitting layers need to be patterned sometimes. As a method for patterning the light emitting layers, recitation is made of a method in which each of the different light emitting colors is coded or vapor deposited through masking or a method in which each of the different light emitting colors is patterned by printing or ink jetting. Furthermore, the arranged light emitting layers may have partitions therebetween. The method of forming the partitions has an advantage that the fluorescent material is not spread over an adjacent area through wetting, when the light emitting layer is formed with the inkjet method or the like. Such partitions can be formed of photosetting type resins such as photosensitive polyimide resin and acrylic resin, a thermosetting type resin, and an inorganic material, for example. In addition, a treatment by which the surface energy (wettability) of the partition forming material is changed may be performed.

(3) Electron Injecting Layer

The material for providing the electron injecting layer is not particularly limited as long as it can stabilize the electron injection into the light emitting layer. For example, aluminum, strontium, calcium, lithium, cesium, magnesium oxide, aluminum oxide, strontium oxide, lithium oxide, lithium fluoride, magnesium fluoride, strontium fluoride, calcium fluoride, barium fluoride, cesium fluoride, alkaline metals or alkaline earth metals such as polymethyl methacrylate polystyrene sodium sulfonate, oxides of an alkaline metal or an alkaline earth metal, fluorides of an alkaline metal or an alkaline earth metal, or organic complexes of an alkaline metal can be presented. In particular, it is preferable to use a fluoride of an alkaline earth metal. A fluoride of an alkaline earth metal improves the stability and the life of the organic EL layer because the fluorine of an alkaline earth metal has a low reactivity with water so as to have little water absorption during or after the film formation of the electron injecting layer compared with the above-mentioned alkaline metal compounds and oxides of an alkaline earth metal. Furthermore, a fluoride of an alkaline earth metal has a higher melting point than that of the above-mentioned alkaline metal compounds so as to have the excellent heat resistance stability.

The thickness of the electron injecting layer is preferably in a range of about 0.2 nm to 20 nm in consideration to the conductivity and the transmittance of the above-mentioned alkaline metals or alkaline earth metal compounds, or the like.

5. Cathode Layer

The cathode layer in the present invention is formed on the charge transporting protection layer and it has the light transmitting properties, which means that it is transparent.

The material for providing the cathode layer 3B and the method for forming the cathode layer 3B are same as those explained for the anode layer 3A.

The material for providing the cathode layer is a conductive material, it is not particularly limited so long as it exhibits transparency. It can be used materials described in the above-mentioned item of "3. Anode layer". In particular, electroconductive inorganic oxides such as In—Sn—O, In—Zn—O, In—O, Zn—O, Zn—O—Al, and Zn—Sn—O are preferable. The electroconductive inorganic oxide allows film formation by a method for adhering a high energy material such as a sputtering method and an ion plating method so that a dense film can be obtained. Moreover, the protection effect of restraining deterioration of the EL layer at the time of forming the cathode layer can be remarkably performed owing to the presence of the charge transporting protection layer between the EL layer and the cathode layer.

As examples the method for forming the cathode layer, a sputtering method, a vacuum heating deposition method, a EB deposition method, and an ion plating method can be presented. In particular, since deterioration of the EL layer at the time of forming the cathode layer can be restrained owing to the presence of the charge transporting protection layer between the EL layer and the cathode layer, as the method for forming the cathode layer, a method for adhering a high energy material such as a sputtering method and an ion plating method can be used preferably. In particular, the sputtering method or the ion plating method is preferable. This is because these methods are for adhering a high energy material as mentioned above so that a film of an electroconductive material having a relatively high melting point such as an electroconductive inorganic oxide can also be formed, and with a preferable film formation efficiency.

B. Production Method for an EL Element

The production method for an EL element disclosed in the present invention comprises the steps of successively laminating on a substrate: an anode layer; an EL layer including at least a light emitting layer; a charge transporting protection layer made of an organic material alone, which has light transmitting properties and a transmittance of 25% or more at the 450 nm to 600 wavelength based on the 100 nm film thickness; and a cathode layer having light transmitting properties, wherein the step of laminating the charge transporting protection layer is carried out by the chemical vapor deposition method, the vacuum deposition method, or the coating method, and the step of laminating the cathode layer is carried out by the sputtering method or the ion plating method.

Since the chemical vapor deposition method, the vacuum deposition method and the coating method in the step of laminating the charge transporting protection layer are described in the above-mentioned item of the charge transporting protection layer of "A. EL element", explanation is omitted here. Moreover, since the sputtering method and the ion plating method in the step of laminating the cathode layer are also described in the above-mentioned item of the cathode layer of "A. EL element", explanation is omitted here. Furthermore, the other points of the substrate, the anode layer, the EL layer and the charge transporting protection layer and the other points of the cathode layer are described in the above-mentioned "A. EL element", explanation is omitted here.

C. Functional Device

Although examples of applying the present invention to an organic EL element have mainly been explained so far, application of the present invention is not limited to the organic EL element. The charge transporting protection layer of the present invention can be used widely for a device required to have the carrier injecting and transporting functions and desired to have a function of restraining the damage at the time of forming a cathode layer, or the like by the vacuum film formation onto a functional layer such as an EL layer.

Furthermore, the functional device of the present invention comprises: an anode layer, a functional layer for performing its function by the electric field or the current, a charge transporting protection layer and a cathode layer provided on a substrate in this order, wherein the charge transporting protection layer is made of an organic material alone, the charge transporting protection layer and the cathode layer have the light transmitting properties, and the transmittance of the charge transporting protection layer based on the 100 nm film thickness with respect to a 450 nm to 600 nm wavelength is 25% or more.

Specifically, the EL layer in the above-mentioned explanation may be various functional layers to perform the function by the electric field or the current so that a functional device comprising such a functional layer is also included in the application range of the present invention. As the functional layer, an inorganic EL layer, a transistor layer, a memory layer, a solar battery layer, a liquid crystal layer, or the like can be presented.

The present invention is not limited to the above-mentioned embodiments. The embodiments are merely examples, and any one having the substantially same configuration as the technological idea disclosed in the claims of the present invention and the same effects is included in the technological scope of the present invention.

EXAMPLES

Hereinafter, the present invention will be described concretely by using Examples and Comparative Examples.

Example 1

First, a thin film of indium tin oxide (ITO) (thickness: 150 nm) was formed on a glass substrate by the sputtering method, and an anode layer was formed. After the anode layer was formed, the resulting substrate was washed, and treated with UV rays and ozone. Afterwards, a solution of polyethylene dioxythiophene-polyestylene sulfonate (abbreviated as "PEDOT-PSS") was applied on the ITO thin film by the spin coating method in the atmosphere, and a hole injecting and transporting layer (thickness: 80 nm) was formed by drying after the application.

Next, a solution of a fluorene based copolymer (manufactured by American Dye Source Inc., Product No. ADS133YE) was applied on the above hole injecting and transporting layer by the spin coating method in a glove box with thin oxygen (oxygen concentration: not more than 0.1 ppm) and low humidity (water vapor concentration: not more than 0.1 ppm), and a light emitting layer (thickness: 50 nm) was formed by drying after the application.

With respect to the substrate formed with the light emitting layer in the above, a Ca thin film (thickness: 10 nm) was formed on the light emitting layer in vacuum (pressure: $1\times10^{-4}$ Pa) by the resistance heating deposition, thereby forming an electron injecting layer.

Next, a charge transporting protection layer (thickness: 100 nm) was formed by depositing a film of N,N'-bis-(3-methylphenyl)-N,N'-bis-(phenyl)-benzidine (TPD) on the electron injecting layer in vacuum (pressure: $1\times10^{-4}$ Pa) by the resistance heating vapor deposition method.

Then, a cathode layer was formed by depositing a thin film of IZO (thickness: 150 nm) on the charge transporting protection layer according to a facing target sputtering method.

After the formation of the cathode layer, an organic EL device was obtained by sealing the resultant with non-alkaline glass in the glove box having thin oxygen (oxygen concentration: not more than 0.1 ppm) and low humidity (water vapor concentration: not more than 0.1 ppm).

Voltage (light emission starting voltage) to afford brightness of 0.01 cd/m$^2$ was measured, while voltage was being applied between the anode layer and the cathode layer of the obtained organic EL device. The measured result was 4.7V. Further, defects such as dark spots were not produced in an area where the organic EL element was observed with unassisted eyes.

Comparative Example 1

An organic EL element was produced by the same method as in Example 1 except that a charge transporting protection layer was not formed and an IZO film was formed directly on the electron injecting layer to form a cathode layer.

With respect to the organic EL element obtained in Comparative Example 1, the light emission starting voltage was measured in the same manner as in Example 1. The measured result was 6.0V.

From the results of Example 1 and Comparative Example 1, in which different light emission starting voltages were observed, it was confirmed that in the organic EL element of Comparative Example 1 where no charge transporting layer was formed, the light emitting characteristics were deteriorated by the sputtering damage upon the electron injecting layer and the light emitting layer. On the other hand, such sputtering damages were suppressed in the organic EL element of Example 1 where the charge transporting protection layer was formed.

Comparative Example 2

An organic EL element was produced by the same method as in Example 1 except that charge transporting protection layer and IZO thin film were not formed and a thin film of Ag (thickness: 150 nm) was formed directly on the electron injecting layer in vacuum (pressure: $1\times10^{-4}$ Pa) by the resistance heating vapor deposition method to form a cathode layer.

The light emission starting voltage was measured for the organic EL element obtained in the Comparative Example 2 in the same manner as in the case of the organic EL element obtained in the Example 1, and it was 4.4 V.

Therefore, from the results of the Comparative Example 2 and the Example 1, it was confirmed that there is substantially no decline, compared with the case of the deposition, of the element characteristics even in the case of forming the cathode layer by sputtering in the organic EL element with the charge transporting protection layer formed prior to the cathode layer formation.

Comparative Example 3

An organic EL element was produced by the same method as in Example 1 except that a thin film of Ag (thickness: 1 nm) instead of a transparent charge transporting material was formed as a protection layer by the resistance heating vapor deposition method.

With respect to the obtained organic EL element, the light emission starting voltage was measured in the same manner as in Example 1. The measured result was 5.4V.

Comparative Example 4

An organic EL element was produced by the same method as in Example 1 except that a thin film of Ag (thickness: 10 nm) instead of the transparent charge transporting material was formed as a protection layer by the resistance heating vapor deposition method.

With respect to the obtained organic EL element, the light emission starting voltage was measured in the same manner as in Example 1. The measured result was 5.3V.

From the results of the Example 1, the Comparative Examples 3 and 4, it was confirmed that the light emission characteristics are lowered by the use of a metal thin film for the protection layer.

Example 2

An organic EL element was obtained in the same manner as in the Example 1 except that the thickness of the charge transporting protection layer was 10 nm.

The light emission starting voltage was measured for the organic EL element obtained in the same manner as in the case of the organic EL element obtained in the Example 1, and it was 5.3 V. From the results of the Examples 1-2, and the Comparative Example 1, it was confirmed that, although the light emission characteristics are improved with a 10 nm thickness of the charge transporting protection layer compared with the case without the charge transporting protection layer, the protection effect is lowered compared with the case where the charge transporting protection layer has a 100 nm thickness so as to lower the light emission characteristics.

Example 3

An organic EL element was obtained in the same manner as in the Example 1 except that the thickness of the charge transporting protection layer was 500 nm.

With respect to the obtained organic EL element, the light emission starting voltage was measured in the same manner as in Example 1. The measured result was 4.7V. It was confirmed that even when the thickness of the charge transporting protection layer is increased up to 500 nm, the light emitting properties does not lowered.

Example 5

An organic EL element was produced by the same method as in Example 1 except that α-NPD was used as a material to form a charge transporting protection layer.

With respect to the organic EL element, the light emission starting voltage was measured in the same manner as in Example 1. The measured result was 4.7V. It was confirmed that even when α-NPD was used for the charge transporting protection layer, the light emitting characteristics equivalent to those in Example 1 were obtained.

Example 6

First, a thin film of indium tin oxide (ITO) (thickness: 150 nm) was formed on a glass substrate by the sputtering method, and an anode layer was formed. After the anode layer was formed, the resulting substrate was washed, and treated with UV rays and ozone. Afterwards, a solution of polyethylene dioxythiophene-polyestylene sulfonate (abbreviated as "PEDOT-PSS") was applied on the ITO thin film by the spin coating method in the atmosphere, and a hole injecting and transporting layer (thickness: 80 nm) was formed by drying after the application.

Next, respective films of α-NPD (thickness: 40 nm), Alq$_3$ (thickness: 60 nm), LiF (thickness: 0.5 nm), and Ca (thickness: 10 nm) were formed on the hole injecting and transporting layer sequentially by the resistance heating vapor deposition in vacuum (pressure: $1 \times 10^{-4}$ Pa), thereby forming a hole transporting layer, a light emitting layer, and a electron injecting layer.

Next, a charge transporting protection layer (thickness: 100 nm) was formed by depositing a film of N,N'-bis-(3-methylphenyl)-N,N'-bis-(phenyl)-benzidine (TPD) on the electron injecting layer in vacuum (pressure: $1 \times 10^{-4}$ Pa) by the resistance heating vapor-deposition method.

Then, a cathode layer was formed by depositing a thin film of IZO (thickness: 150 nm) on the charge transporting protection layer according to a facing target sputtering method.

After the formation of the cathode layer, an organic EL device was obtained by sealing the resultant with non-alkaline glass in the glove box having thin oxygen (oxygen concentration: not more than 0.1 ppm) and low humidity (water vapor concentration: not more than 0.1 ppm).

With respect to the obtained organic EL element, the light emission starting voltage was measured in the same manner as in Example 1. The measured result was 2.3V. Further, defects such as dark spots were not produced in an area where the organic EL element was observed with unassisted eyes.

Comparative Example 5

An organic EL element was produced by the same method as in Example 6 except that a charge transporting protection layer was not formed and an IZO film was formed directly on the electron injecting layer to form a cathode layer.

With respect to the organic EL element obtained in Comparative Example 5, the light emission starting voltage was measured in the same manner as in Example 6. The measured result was 2.4V.

From the results of Comparative Example 5 and Example 6, in which different light emission starting voltages were observed, it was confirmed that, in the organic EL element of Comparative Example 5 where no charge transporting layer was formed, the light emitting characteristics were deteriorated by the sputtering damage upon the electron injecting layer and the light emitting layer. On the other hand, such sputtering damages were suppressed in the organic EL element of Example 6 where the charge transporting protection layer was formed.

Comparative Example 6

An organic EL element was produced by the same method as in Example 6 except that charge transporting protection layer and IZO thin film were not formed and a thin film of Ag (thickness: 150 nm) was formed directly on the electron injecting layer in vacuum (pressure: $1 \times 10^{-4}$ Pa) by the resistance heating vapor deposition method.

The light emission starting voltage was measured for the organic EL element obtained in the Comparative Example 6 in the same manner as in the case of the organic EL element obtained in the Example 6, and it was 2.3 V.

Therefore, from the results of the Comparative Example 6 and the Comparative Example 6, it was confirmed that there is substantially no decline, compared with the case of the deposition, of the element characteristics even in the case of forming the cathode layer by sputtering in the organic EL element with the charge transporting protection layer formed prior to the cathode layer formation.

REFERENCE EXAMPLE

Only an Ag thin film (thickness: 1 nm) was formed on a glass substrate that used in Example 1 by the resistance heating vapor deposition method. Forming conditions for the thin film were the same as those applied in the Comparative Example 3.

Further, only an Ag thin film (thickness: 10 nm) was formed on a glass substrate as that used in Example 1 by the resistance heating vapor deposition method. Forming conditions for the thin film were the same as those applied in the Comparative Example 4.

Measurement of the transmittances of the obtained Ag thin films with a spectrophotometer revealed that the 1 nm-thick Ag thin film and the 10 nm-thick Ag thin film gave the transmittances of 92% and 41%, respectively. It was confirmed from these results that when the thickness of the Ag thin film was not less than 10 nm, the transmittance was greatly decreased.

Only a charge transporting protection layer comprising a TPD thin film (thickness: 100 nm) was formed in the same manner as in the Example 1 on the same glass substrate as that used in the Example 1. According to the measurement of the transmittance of the obtained TPD thin film with a spectrophotometer, the transmittance at a 550 nm wavelength was 96%. From the results, it was confirmed that the TPD thin film has a high transparency.

Moreover, according to the measurement of the transmittance in the all wavelength range of 450 nm to 650 nm of the above-mentioned TPD thin film (thickness: 100 nm) with a spectrophotometer, the minimum value of the transmittance was 95% (wavelength 650 nm).

Only a charge transporting protection layer comprising a α-NPD thin film (thickness: 100 nm) was formed in the same manner as in the Example 5 on the same glass substrate as that used in the Example 1. According to the measurement of the transmittance in the all wavelength range of 450 nm to 650 nm of the obtained α-NPD thin film (thickness: 100 nm) with a spectrophotometer, the minimum value of the transmittance was 93% (wavelength 650 nm).

The thickness of each of the above films was a value estimated from the film-forming rate based on the film thickness when each film was formed on the washed glass substrate in the form of a single film. A probe microscope (manufactured by SII Nanotechnology Inc., Nanopics 1000) was used for the measurement of the film thicknesses.

DESCRIPTION OF THE REFERENCE NUMERAL

1 ... EL element
2 ... Substrate
3 ... Electrode layer (3A: anode layer, 3B: cathode layer)
4 ... EL layer
5 ... Charge transporting protection layer
41 ... Hole injecting and transporting layer
42 ... Light emitting layer
43 ... Electron injecting layer

What is claimed is:

1. An electroluminescence element comprising: an anode layer, an electroluminescence layer including at least a light emitting layer, a charge transporting protection layer and a cathode layer provided in this order on a substrate,
   wherein the charge transporting protection layer is made of an organic material alone, the charge transporting protection layer and the cathode layer have light transmitting properties, and
   wherein the charge transporting protection layer satisfies the following conditions: when the charge transporting protection layer is 100 nm film thickness, a transmittance of the charge transporting protection layer at a 450 to 600 nm wavelength is 25% or more.

2. The electroluminescence element according to claim 1, wherein the electroluminescence layer includes an electron injecting layer, and the electron injecting layer is formed between the light emitting layer and the charge transporting protection layer.

3. The electroluminescence element according to claim 1, wherein thickness of the charge transporting protection layer is 70 nm to 1,000 nm.

4. The electroluminescence element according to claim 2, wherein thickness of the charge transporting protection layer is 70 nm to 1,000 nm.

5. A production method for an electroluminescence element, comprising steps of successively laminating on a substrate:
   an anode layer,
   an electroluminescence layer including at least a light emitting layer,
   a charge transporting protection layer made of an organic material alone, which has light transmitting properties and satisfies the following conditions: when the charge transporting protection layer is 100 nm film thickness, a transmittance of the charge transporting protection layer is 25% or more at a 450 nm to 600 nm wavelength, and
   a cathode layer having light transmitting properties,
   wherein the step of laminating the charge transporting protection layer is carried out by a chemical vapor deposition method, a vacuum deposition method, or a coating method, and the step of laminating the cathode layer is carried out by a sputtering method or an ion plating method.

6. The production method for an electroluminescence element according to claim 5, wherein thickness of the charge transporting protection layer is 70 nm to 1,000 nm.

* * * * *